(12) United States Patent
Zhang

(10) Patent No.: US 8,988,154 B2
(45) Date of Patent: Mar. 24, 2015

(54) VOLTAGE-TO-CURRENT CONVERTER AND VOLTAGE CONTROLLED OSCILLATOR HAVING VOLTAGE-TO-CURRENT CONVERTER

(71) Applicant: Media Tek Singapore Pte. Ltd., Singapore (SG)

(72) Inventor: Huajiang Zhang, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 94 days.

(21) Appl. No.: 13/798,122

(22) Filed: Mar. 13, 2013

(65) Prior Publication Data

US 2014/0104005 A1  Apr. 17, 2014

Related U.S. Application Data

(60) Provisional application No. 61/712,328, filed on Oct. 11, 2012.

(51) Int. Cl.
| | |
|---|---|
| H03K 3/03 | (2006.01) |
| H03L 7/00 | (2006.01) |
| G05F 3/02 | (2006.01) |
| H03L 7/099 | (2006.01) |

(52) U.S. Cl.
CPC .. *H03L 7/00* (2013.01); *G05F 3/02* (2013.01); *H03K 3/0315* (2013.01); *H03L 7/0995* (2013.01)
USPC ............ 331/57; 331/177 R; 331/175; 331/34; 327/103

(58) Field of Classification Search
CPC ................. H03L 7/24; H03K 3/0315

USPC ............ 331/34, 57, 16, 175, 177 R; 327/103
See application file for complete search history.

(56) References Cited

U.S. PATENT DOCUMENTS

| | | | |
|---|---|---|---|
| 5,231,316 A * | 7/1993 | Thelen, Jr. ..................... 327/103 |
| 5,515,012 A | 5/1996 | Bhushan et al. | |
| 5,523,723 A | 6/1996 | Arcus et al. | |
| 5,544,120 A * | 8/1996 | Kuwagata et al. ............ 365/222 |
| 5,917,368 A * | 6/1999 | Tan et al. ....................... 327/543 |
| 6,404,295 B1 | 6/2002 | Minami et al. | |
| 6,414,863 B1 | 7/2002 | Bayer et al. | |
| 7,015,766 B1 * | 3/2006 | Guo et al. ...................... 331/176 |
| 8,111,054 B2 | 2/2012 | Yen et al. | |
| 8,604,884 B2 * | 12/2013 | Coban et al. .................... 331/57 |
| 8,692,627 B2 * | 4/2014 | Chuang ......................... 331/185 |
| 2011/0057736 A1 | 3/2011 | Badillo | |
| 2012/0256693 A1* | 10/2012 | Raghunathan et al. ......... 331/34 |

* cited by examiner

*Primary Examiner* — Arnold Kinkead
(74) *Attorney, Agent, or Firm* — Winston Hsu; Scott Margo

(57) ABSTRACT

A voltage controlled oscillator includes a voltage-to-current converter and a current controlled oscillator, where the voltage-to-current converter is used for converting an input voltage to generate an output current, and the current controlled oscillator is used for generating an output frequency signal according to the output current. In addition, the voltage-to-current converter includes an input terminal, a resistor, a current mirror and a current generating circuit, where the input terminal is for receiving the input voltage; the resistor is coupled to the input terminal; the current mirror is coupled to the resistor, and is used for mirroring a reference current to generate a mirrored current, where the reference current is formed according to at least a current flowing through the resistor; and the current generating circuit is coupled to the current mirror, and is used for generating the output current according to at least the mirrored current.

14 Claims, 4 Drawing Sheets

US 8,988,154 B2

VOLTAGE-TO-CURRENT CONVERTER AND VOLTAGE CONTROLLED OSCILLATOR HAVING VOLTAGE-TO-CURRENT CONVERTER

CROSS REFERENCE TO RELATED APPLICATIONS

This application claims the priority of U.S. Provisional Application No. 61/712,328, filed on Oct. 11, 2012, which is included herein by reference in its entirety.

BACKGROUND

To extend a frequency range and to cover process, voltage and temperature (PVT) variation, a voltage controlled oscillator usually requires a large gain. The large gain, however, may cause more noise and supply pushing (due to increased sensitivity to the variation of a supply voltage). To solve this problem, one solution provides a set of sub-bands each having smaller gains compared to the voltage controlled oscillator for preventing the noise and supply pushing issues; a disadvantage of this solution, however, is that this technique requires digital calibration that results in greater manufacturing costs. Another type of voltage controlled oscillator with linear input voltage characteristics may have smaller gain and does not use digital calibration; a disadvantage of this solution, however, is that the linear range of this type of voltage controlled oscillator may not cover the full input range.

SUMMARY

It is therefore an objective of the present invention to provide a voltage controlled oscillator with a linear voltage-to-current converter, which has smaller gain, does not use digital calibration, and covers most of or the full input range, to solve the above-mentioned problems.

According to one embodiment of the present invention, a voltage-to-current converter for converting an input voltage to generate an output current comprises an input terminal, a resistor, a current mirror and a current generating circuit, where the input terminal is for receiving the input voltage; the resistor is coupled to the input terminal; the current mirror is coupled to the resistor, and is used for mirroring a reference current to generate a mirrored current, where the reference current is formed according to at least a current flowing through the resistor; and the current generating circuit is coupled to the current mirror, and is used for generating the output current according to at least the mirrored current.

According to another embodiment of the present invention, a voltage controlled oscillator comprises a voltage-to-current converter and a current controlled oscillator, where the voltage-to-current converter is used for converting an input voltage to generate an output current, and the current controlled oscillator is used for generating an output frequency signal according to the output current. In addition, the voltage-to-current converter comprises an input terminal, a resistor, a current mirror and a current generating circuit, where the input terminal is for receiving the input voltage; the resistor is coupled to the input terminal; the current mirror is coupled to the resistor, and is used for mirroring a reference current to generate a mirrored current, where the reference current is formed according to at least a current flowing through the resistor; and the current generating circuit is coupled to the current mirror, and is used for generating the output current according to at least the mirrored current.

According to another embodiment of the present invention, a voltage controlled oscillator comprises a voltage-to-current converter and a current controlled oscillator, where the voltage-to-current converter is used for converting an input voltage to generate an output current, and the current controlled oscillator is used for generating an output frequency signal according to the output current. In addition, the voltage-to-current converter comprises an input terminal, a resistor, a first current source, a second current source, a current mirror and a current generating circuit, where the input terminal is for receiving the input voltage; the resistor is coupled to the input terminal; the first current source is for supplying a first current; the second current source is for supplying a second current; the current mirror is coupled to the resistor at a connection node and coupled to the first current source and the second current source, and is used for mirroring a reference current to generate a mirrored current by utilizing a first equation $Ir=(Vtune-VA)/Rin+n*IB$, Ir is the reference current and the mirrored current, Vtune is the input voltage, VA is a voltage of the connection node, Rin is a resistance of the resistor, $n*IB$ is the first current; and the current generating circuit is coupled to the current mirror, and is used for generating the output current by utilizing a equation $Itune=Ir-IB$, where IB is the second current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
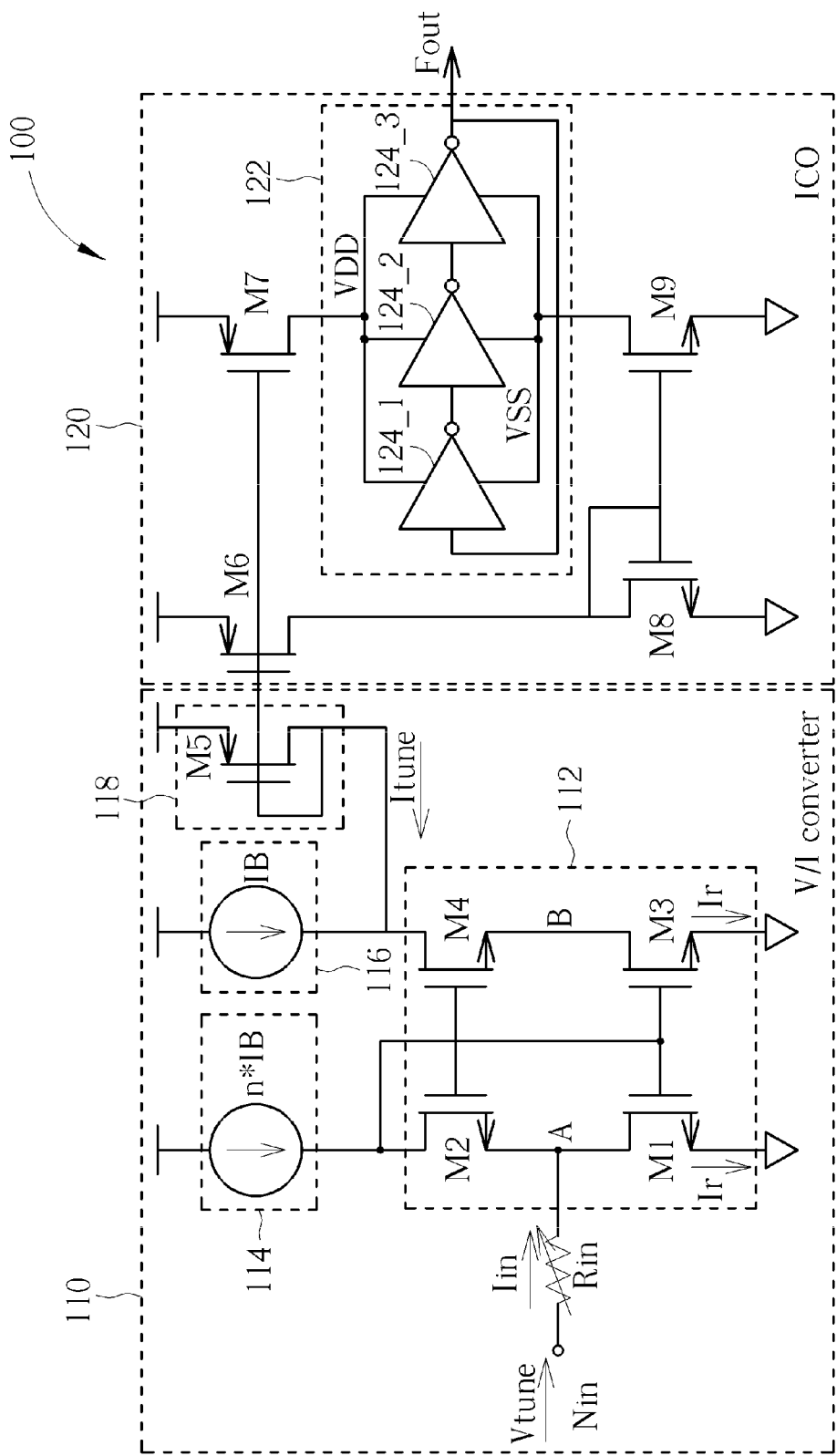
FIG. 1 is a diagram illustrating a voltage controlled oscillator according to one embodiment of the present invention.

Please refer to FIG. 1, which is a diagram illustrating a voltage controlled oscillator 100 according to one embodiment of the present invention, where the voltage controlled oscillator 100 is used to receive an input voltage Vtune to generate an output frequency signal Fout. As shown in FIG. 1, the voltage controlled oscillator 100 comprises a voltage-to-current (V/I) converter 110 and a current controlled oscillator (ICO) 120. The V/I converter 110 includes an input terminal Nin, a resistor Rin, a first current source 114, a second current source 116, a current mirror 112 and a current generating circuit 118, where the current mirror 112 includes four transistors M1-M4, the transistors M1 and M2 are connected in cascode, the transistors M3 and M4 are connected in cascode, the transistor M2 is connected to the first current source 114, the transistor M4 is connected to the second current source 116, and the resistor Rin is connected to a source electrode of the transistor M2 and a drain electrode of the transistor M1. The current generating circuit 118 is implemented by a transistor M5. In addition, the current controlled oscillator 120 includes four transistors M6-M8 and a ring oscillator 122 including three inverters 124_1-124_3. In addition, in this embodiment, the transistors M1-M4, M8 and M9 are N-type Metal Oxide Semiconductors (NMOS), and M5-M7 are P-type Metal Oxide Semiconductor (PMOS).

The first current source 114 supplies a first current n*IB to the transistor M2, and the second current source 116 supplies a second current IB to the transistor M4, where the first current n*IB is greater than or equal to the second current IB (i.e., n>=1).

In the operations of the voltage controlled oscillator 100, the reference current Ir is generated according to a current flowing through the resistor Rin and the first current n*IB of the first current source 114; that is the reference current Ir=Iin+n*IB=(Vtune−VA)/Rin+n*IB. The current mirror 112 mirrors the Ir to generate a mirrored current flowing through the transistors M3 and M4. Then, the output current Itune flowing through the transistor M5 is determined as follows: Itune=Ir−IB. Therefore, the output current Itune of the V/I converter 110 is equal to:

$$Itune=Ir-IB=(Vtune-VA)/Rin+n*IB-IB \quad (1).$$

As shown by referring to the equation (1), the relationship between the output current Itune and the input voltage Vtune of the V/I converter 110 is linear. In detail, when n>1 and n is set to be higher than a specific value, the linear range of V/I converter 110 can cover the full input range (i.e. the relationship between the output current Itune and the input voltage Vtune is also linear when the input voltage Vtune is from 0~VA). In addition, when n=1, the relationship between the output current Itune and the input voltage Vtune may not be linear when the input voltage Vtune is from 0~VA, but the linear range of V/I converter 110 can still cover most of the input range.

The transistors M6 and M7 mirror the output current Itune flowing through the transistor M5, and the ring oscillator 122 generates an output frequency signal Fout according to the output current Itune. The frequency fvco of the output frequency signal Fout is as follows:

$$fvco=1/(N*td)=Itune/(N*C_L*(VDD-VSS)) \quad (2),$$

where N is a number of the inverters of the ring oscillator 122 (in FIG. 1, N=3), td is a delay amount of each inverter, $C_L$ is a capacitance at a terminal of the inverter, and VDD and VSS are supply voltages of the ring oscillator 122.

Referring to the above equations (1) and (2), the frequency fvco of the output frequency signal Fout of the voltage controlled oscillator can be represented as follows:

$$fvco = \frac{Vtune}{NC_L(VDD-VSS)Rin} + \frac{(n-1)IB*Rin - VA}{NC_L(VDD-VSS)Rin} \quad (3)$$

Figure 2A:
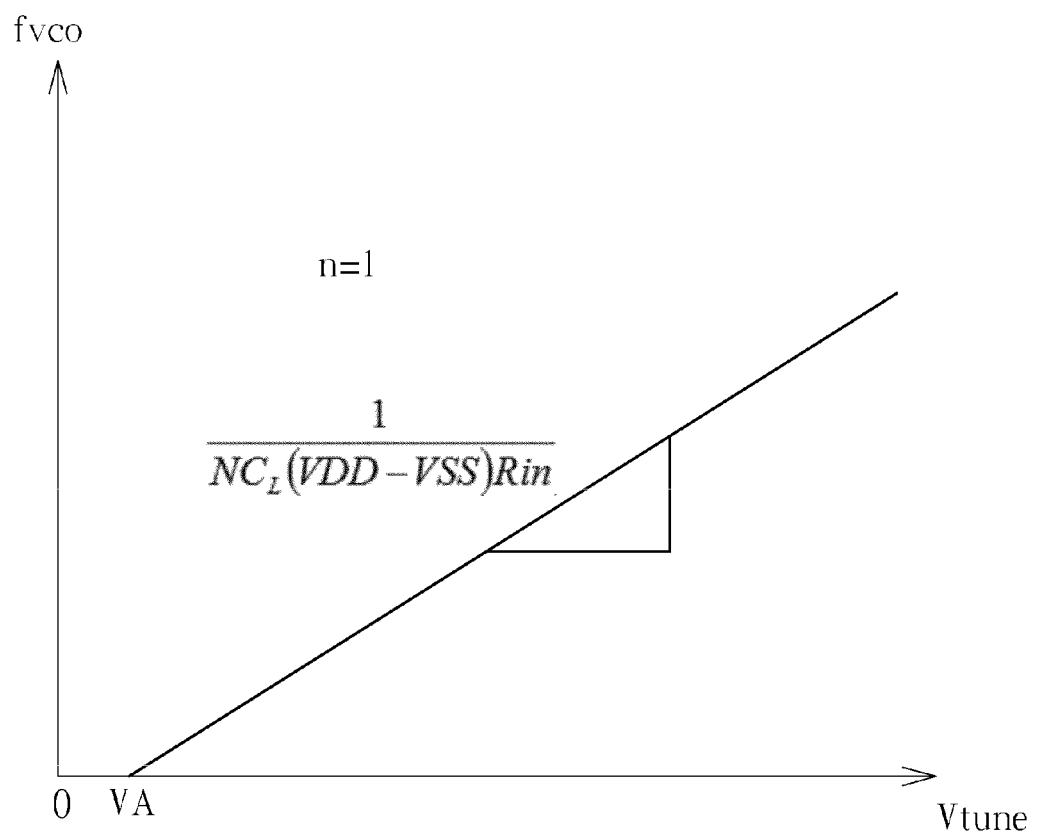
FIG. 2A and FIG. 2B show the relationship between a frequency of an output frequency signal of a voltage controlled oscillator and an input voltage of the voltage controlled oscillator when n=1 and n>1.
Figure 2B:
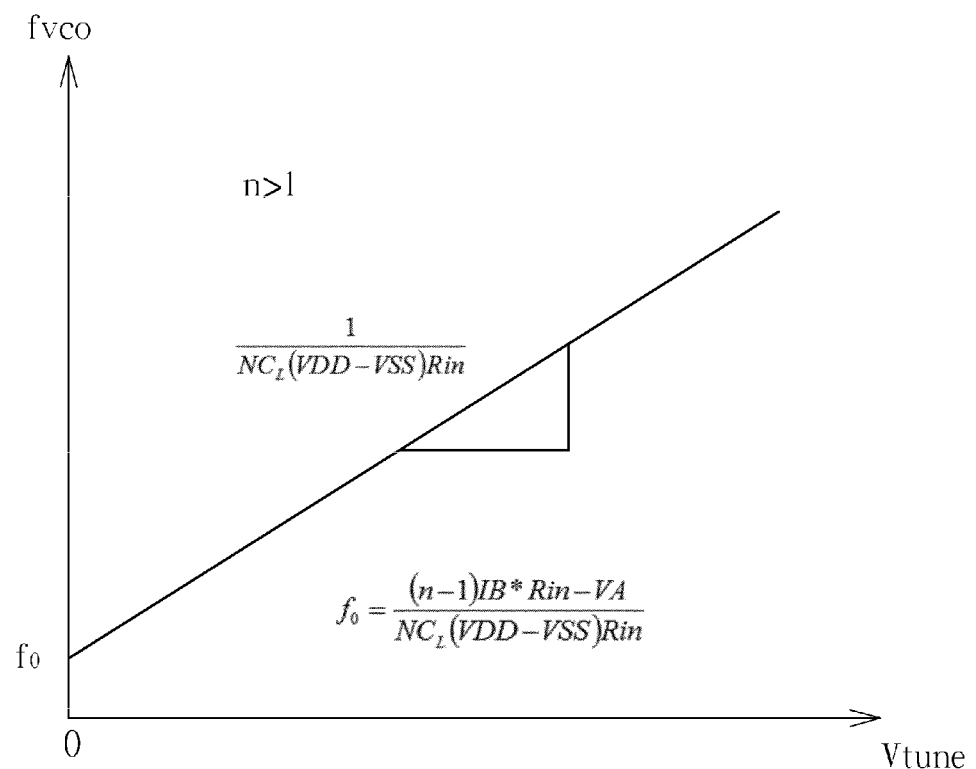

FIG. 2A and FIG. 2B show the relationship between the frequency fvco and the input voltage Vtune when n=1 and n>1, respectively. As shown in FIG. 2B, the relationship between the frequency fvco and the input voltage Vtune is linear for the whole input range of the input voltage Vtune.

In light of the above, in the voltage controlled oscillator 100 shown in FIG. 1, the voltage controlled oscillator 100 can have a smaller gain to prevent noise and supply pushing, and the voltage controlled oscillator 100 can be operated linearly without using a plurality of sub-bands and digital calibration. In addition, the voltage controlled oscillator 100 can cover most of or the full input range by using a simple and cheap circuit structure.

Furthermore, because the voltage controlled oscillator 100 has the above-described advantages, the voltage controlled oscillator 100 is especially suitable for use in a near field communication (NFC) or radio frequency identification (RFID) device that generally requires a simple circuit structure that does not use digital processing.

It is noted that the voltage controlled oscillator 100 shown in FIG. 1 is merely an embodiment of the present invention, and is not a limitation of the present invention. In other embodiments, the drain electrode of the transistor M2 may not be connected to the gate electrode of the transistor M1, and the gate electrode of the transistor M1 can be supplied by an appropriate bias voltage. The resistor Rin can be a variable resistor or a resistor having a fixed resistance. The current generating circuit 118 may be implemented by two transistors connected in cascode. The current controlled oscillator 120 can have any other circuit structure. The ring oscillator 122 can be replaced by any other suitable oscillator. These alternative designs also fall within the scope of the present invention.

Figure 3:
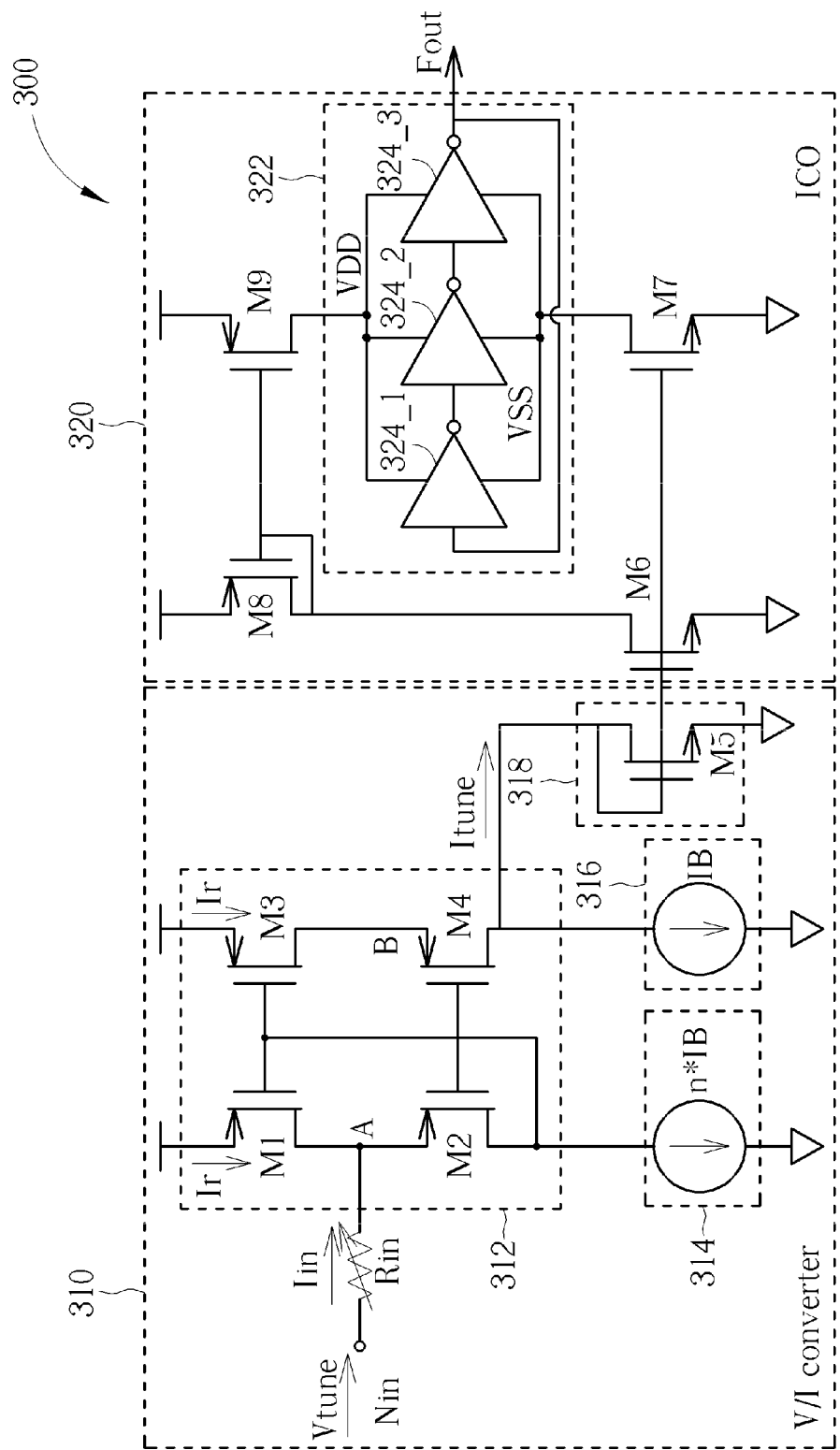
FIG. 3 is a diagram illustrating a voltage controlled oscillator according to another embodiment of the present invention.

Please refer to FIG. 3, which is a diagram illustrating a voltage controlled oscillator 300 according to another embodiment of the present invention, where the voltage controlled oscillator 300 is used to receive an input voltage Vtune to generate an output frequency signal Fout. As shown in FIG. 3, the voltage controlled oscillator 300 comprises a voltage-to-current (V/I) converter 310 and a current controlled oscillator (ICO) 320. The V/I converter 310 includes an input terminal Nin, a resistor Rin, a first current source 314, a second current source 316, a current mirror 312 and a current generating circuit 318, where the current mirror 312 includes four transistors M1-M4, the transistors M1 and M2 are connected in cascode, the transistors M3 and M4 are connected in cascode, the transistor M2 is connected to the first current source 314, the transistor M4 is connected to the second current source 316, and the resistor Rin is connected to a source electrode of the transistor M2 and a drain electrode node of the transistor M1. The current generating circuit 318 is implemented by a transistor M5. In addition, the current controlled oscillator 320 includes four transistors M6-M8 and a ring oscillator 322 including three inverters 324_1-324_3. In addition, in this embodiment, the transistors M1-M4, M8 and M9 are PMOS, and M5-M7 are NMOS.

The first current source 314 supplies a first current n*IB to the transistor M2, and the second current source 316 supplies a second current IB to the transistor M4, where the first current n*IB is greater than or equal to the second current IB (i.e., n>=1).

The voltage controlled oscillator 300 shown in FIG. 3 is similar to the voltage controlled oscillator 100 shown in FIG. 1, the differences between these two embodiments being that the circuits implemented by the PMOS shown in FIG. 1 are implemented by NMOS shown in FIG. 3, the circuits implemented by the NMOS shown in FIG. 1 are implemented by PMOS shown in FIG. 3, and each respective circuit arrangement is according to the NMOS/PMOS implementations.

Due to these similarities, a detailed understanding of the operations of the voltage controlled oscillator 300 can be known by referring to the above disclosure relating to the voltage controlled oscillator 100. The voltage controlled oscillator 300 shown in FIG. 3 can achieve a smaller gain to prevent noise and supply pushing, and the voltage controlled oscillator 300 can be operated linearly without using a plurality of sub-bands and digital control/calibration. In addition, the voltage controlled oscillator 300 can cover most of or a full input range by using a simple and cheap circuit structure.

Furthermore, because the voltage controlled oscillator 300 has the above-described advantages, the voltage controlled oscillator 300 is especially suitable for use in an NFC or RFID device that generally requires a simple circuit structure without the use of digital processing.

It is noted that the voltage controlled oscillator 300 shown in FIG. 3 is merely an embodiment of the present invention, and is not a limitation of the present invention. In other embodiments, the drain electrode of the transistor M2 may not be connected to the gate electrode of the transistor M1, and the gate electrode of the transistor M1 can be supplied by an appropriate bias voltage. The resistor Rin can be a variable resistor or a resistor having a fixed resistance. The current generating circuit 318 may be implemented by two transistors connected in cascode. The current controlled oscillator 320 can have any other circuit structure. The ring oscillator 322 can be replaced by any other suitable oscillator. These alternative designs also fall within the scope of the present invention.

The voltage controlled oscillator of the present invention comprises a V/I converter and a current controlled oscillator, wherein the V/I can linearly convert the input voltage to the output current, and the current controlled oscillator generates the output frequency signal by using the output current. The voltage controlled oscillator of the present invention can have a smaller gain than conventional voltage controlled oscillators, can be operated linearly without using a plurality of sub-bands and digital control/calibration, and the voltage controlled oscillator can cover most of or a full input range by using a simple and cheap circuit structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage-to-current converter, for converting an input voltage to generate an output current, comprising:
   an input terminal, for receiving the input voltage;
   a resistor, coupled to the input terminal, wherein the resistor is a variable resistor mirror coupled to a current controlled oscillator;
   a current mirror, coupled to the resistor, for mirroring a reference current to generate a mirrored current, wherein the reference current is formed according to at least a current flowing through the resistor, and the mirrored current is used for generating the output current;
   a first current source, for supplying a first current to the current mirror; and
   a second current source, for supplying a second current to the current mirror;
   wherein the first current is greater or equal to the second current.

2. The voltage-to-current converter of claim 1, wherein the reference current is formed by the first current and the current flowing through the resistor.

3. The voltage-to-current converter of claim 1, wherein the voltage-to-current converter further comprises a current generating circuit, and the current generating circuit generates the output current by utilizing the mirrored current and the second current.

4. The voltage-to-current converter of claim 1, wherein the current mirror comprises:
   a first transistor and a second transistor connected in cascode, wherein each of the first transistor and the second transistor comprises a first node, a second node and a control node, the first node of the first transistor is connected to the second node of the second transistor, and the first node of the second transistor is connected to the first current source; and
   a third transistor and a fourth transistor connected in cascode, wherein each of the third transistor and the fourth transistor comprises a first node, a second node and a control node, the first node of the third transistor is connected to the second node of the fourth transistor, the control node of the third transistor is connected to the control node of the first transistor, the control node of the fourth transistor is connected to the control node of the second transistor, and the first node of the fourth transistor is connected to the second current source;
   wherein the resistor is connected to the first node of the first transistor.

5. The voltage-to-current converter of claim 4, wherein the voltage-to-current converter further comprises a current generating circuit for generating the output current, and the current generating circuit is a fifth transistor connected to the first node of the fourth transistor.

6. The voltage-to-current converter of claim 1, applied to a near field communication (NFC) or radio frequency identification (RFID) device.

7. A voltage controlled oscillator, comprising:
   a voltage-to-current converter, for converting an input voltage to generate an output current, comprising:
      an input terminal, for receiving the input voltage;
      a resistor, coupled to the input terminal;
      a current mirror, coupled to the resistor, for mirroring a reference current to generate a mirrored current, wherein the reference current is formed according to at least a current flowing through the resistor, and the mirrored current is used for generating the output current;
      a first current source, for supplying a first current to the current mirror; and
      a second current source, for supplying a second current to the current mirror, wherein the first current is greater than or equal to the second current; and
   a current controlled oscillator, coupled to the voltage-to-current converter, for generating an output frequency signal according to the output current, wherein the resistor is a variable resistor and is mirror coupled to a current controlled oscillator.

8. The voltage controlled oscillator of claim 7, wherein the reference current is formed by the first current and the current flowing through the resistor.

9. The voltage controlled oscillator of claim 7, wherein the voltage-to-current converter further comprises a current generating circuit, and the current generating circuit generates the output current by utilizing the mirrored current and the second current.

10. The voltage controlled oscillator of claim 7, wherein the current mirror comprises:
    a first transistor and a second transistor connected in cascode, wherein each of the first transistor and the second transistor comprises a first node, a second node and a control node, the first node of the first transistor is connected to the second node of the second transistor, and the first node of the second transistor is connected to the first current source; and a third transistor and a fourth transistor connected in cascode, wherein each of the third transistor and the fourth transistor comprises a first node, a second node and a control node, the first node of the third transistor is connected to the second node of the fourth transistor, the control node of the third transistor is connected to the control node of the first transistor, the control node of the fourth transistor is connected to the control node of the second transistor, and the first node of the fourth transistor is connected to the second current source;

wherein the resistor is connected to the first node of the first transistor.

11. The voltage controlled oscillator of claim 10, wherein the voltage-to-current converter further comprises a current generating circuit for generating the output current, and the current generating circuit is a fifth transistor connected to the first node of the fourth transistor.

12. A voltage controlled oscillator, comprising:
a voltage-to-current converter, for converting an input voltage to generate an output current, comprising:
an input terminal, for receiving the input voltage;
a resistor, coupled to the input terminal;
a current mirror, coupled to the resistor, for mirroring a reference current to generate a mirrored current, wherein the reference current is formed according to at least a current flowing through the resistor, and the mirrored current is used for generating the output current; and a current controlled oscillator, coupled to the voltage-to-current converter, for generating an output frequency signal according to the output current;
wherein the resistor is a variable resistor and is mirror coupled to a current controlled oscillator.

13. The voltage controlled oscillator of claim 7, applied to a near field communication (NFC) or radio frequency identification (RFID) device.

14. A voltage controlled oscillator, comprising:
a voltage-to-current converter, for converting an input voltage to generate an output current, comprising:
an input terminal, for receiving the input voltage;
a resistor, coupled to the input terminal;
a first current source, for supplying a first current;
a second current source, for supplying a second current;
a current mirror, coupled to the resistor at a connection node and coupled to the first current source and the second current source, for mirroring a reference current to generate a mirrored current by utilizing a first equation $Ir=(Vtune-VA)/Rin+n*IB$, Ir is the reference current and the mirrored current, Vtune is the input voltage, VA is a voltage of the connection node, Rin is a resistance of the resistor, n*IB is the first current; and
a current generating circuit, coupled to the current mirror, for generating the output current by utilizing a equation $Itune=Ir-IB$, where IB is the second current;
a current controlled oscillator, coupled to the current generating circuit of the voltage-to-current converter, for generating an output frequency signal according to the output current, wherein the resistor is a variable resistor and is mirror coupled to the current controlled oscillator.

* * * * *

UNITED STATES PATENT AND TRADEMARK OFFICE
CERTIFICATE OF CORRECTION

PATENT NO.        : 8,988,154 B2
APPLICATION NO.   : 13/798122
DATED             : March 24, 2015
INVENTOR(S)       : Huajiang Zhang Page 1 of 1

It is certified that error appears in the above-identified patent and that said Letters Patent is hereby corrected as shown below:

On the title page, item (71), correct the name of the applicant from "Media Tek Singapore Pte. Ltd." to --MediaTek Singapore Pte. Ltd.--.

Signed and Sealed this
Fifteenth Day of December, 2015

Michelle K. Lee
*Director of the United States Patent and Trademark Office*